United States Patent [19]

Torii et al.

[11] 4,129,842

[45] Dec. 12, 1978

[54] U-SHAPED MICROSTRIP RESONANT CIRCUIT

[75] Inventors: Kenichi Torii, Yokohama; Shigeo Fujimori, Ichikawa, both of Japan

[73] Assignee: Tokyo Shibaura Electric Co., Ltd., Kawasaki, Japan

[21] Appl. No.: 768,906

[22] Filed: Feb. 15, 1977

[30] Foreign Application Priority Data

Feb. 18, 1976 [JP] Japan .................................. 51-16754

[51] Int. Cl.[2] ............................ H03J 3/18; H03B 5/08

[52] U.S. Cl. ........................................ 334/15; 331/96; 331/117 D; 331/177 V; 333/73 S; 333/82 B; 334/45

[58] Field of Search .................... 331/36 C, 96, 177 V, 331/101, 117 D; 333/73 S, 82 R, 82 B; 334/15, 45

[56] References Cited

U.S. PATENT DOCUMENTS

| | | | |
|---|---|---|---|
| 3,001,069 | 9/1961 | Hubbard | 334/45 |
| 3,471,812 | 10/1969 | Lackner | 334/45 X |
| 3,806,844 | 4/1974 | Buckley et al. | 334/15 |
| 3,970,974 | 7/1976 | Bastian | 334/45 |
| 4,025,882 | 5/1977 | Takeo | 334/45 |

FOREIGN PATENT DOCUMENTS

| | | | |
|---|---|---|---|
| 1466065 | 5/1969 | Fed. Rep. of Germany | 334/45 |
| 1917308 | 10/1970 | Fed. Rep. of Germany | 334/45 |

*Primary Examiner*—Paul L. Gensler

*Attorney, Agent, or Firm*—Oblon, Fisher, Spivak, McClelland & Maier

[57] ABSTRACT

In one embodiment, a resonant circuit comprising a ground-contacting conductive member, a dielectric layer provided on the ground-contacting conductive layer, a ground-contacting member provided on the dielectric layer and electrically connected to the ground-contacting conductive member, and a U-shaped microstrip line formed on the dielectric layer. Both ends of the U-shaped microstrip line face the ground-contacting member. One of them is connected to the ground-contacting member through a lumped capacitor, and the other end is directly connected to the ground-contacting member.

9 Claims, 20 Drawing Figures

U-SHAPED MICROSTRIP RESONANT CIRCUIT

BACKGROUND OF THE INVENTION

This invention relates to a resonant circuit including a strip member and more particularly to a resonant circuit utilizing a strip member formed in a U-shape.

A recent trend is toward application of a microstrip line structure to design a smaller solid-state circuitry for a UHF television tuner. To cite an instance, the U.S. Pat. No. 3,659,205 for "A VARACTOR TUNED MICROSTRIP TUNER" sets forth microstrip members formed in the "L", "T" and "U" shapes for use with a television tuner. As described in the specification of said United States patent, the "U" shaped microstrip member itself does not act as a resonance line, but is used simply for coupling resonant lines lying on both sides of said microstrip member. Application of a microstrip member as a resonant circuit generally raises problems in respect of an output and impedance. FIG. 1 shows an oscillator circuit formed of a resonant circuit including the prior art microstrip line for use with a UHF television tuner. A resonant circuit 10 included in said oscillator circuit is a shortened quarter wavelength type. This resonant circuit 10 is formed of as I shaped distributed line 11 and lumped capacitor 12 connected in series. Further, the resonant circuit 10 is connected between the opposite ground-contacting portions 13, 14 of the oscillating circuit and is also disposed within a feedback loop of a signal oscillating section 15. An output signal from the signal oscillating section 15 passes through an L-shaped output circuit 16 coupled to the resonant circuit 10 and is issued from an output terminal 17.

According to the arrangement of said oscillation, impedance occurring in the ground-contacting portions 13, 14 surrounding the signal-oscillating section 15 is equivalently applied in series to both ends of a series circuit formed of the distribued line 11 and lumped capacitor 12. The equivalent introduction of the impedance leads to prominent loses of energy charged into and discharged from the lumped capacitor 12, and in consequence a decreased output power from the signal oscillating section 15. Further, an inductance between the opposite ground-contacting portions 13, 14 and a floating capacitance appearing in the ground-contacting portion 13 give rise to parasitic oscillations which are repeated at a different frequency from the resonance frequency of the resonance circuit 10 which is defined by an inductance in the distributed line 11 and a capacitance of the lumped capacitor 12. The parasitic oscillations also constitute a factor of decreasing an oscillated output power having a given resonance frequency component. Therefore, the prior art oscillator circuit of FIG. 1 using a resonance circuit formed of a microstrip line has the drawbacks that it is extremely difficult to produce oscillated signals at a prescribed frequency band ranging, for example, between 517 and 931 MHz which is demanded of an output signal from a local oscillating circuit included in a UHF television tuner, regardless of changes in the capacitance of the lumped capacitor 12; and the oscillator circuit generates a small amount of power.

SUMMARY OF THE INVENTION

It is accordingly an object of this invention to provide a resonance circuit including a strip member which comprises a distributed line formed in a U-shape.

Another object of the invention is to provide various application using said resonance circuit.

Still another object of the invention is to provide a UHF television tuner using a resonant circuit including a U-shaped strip line.

According to one embodiment of this invention, the microstrip member included in the resonant circuit comprises a ground conductor plate, a dielectric layer formed on said ground conductor plate and a U-shaped microstrip line formed on the dielectric layer to act as a distributed line with both ends of said distributed line so disposed as to face the edge portion of the ground-contacting conductive plate.

According to this invention, the resonant circuit including a strip member which comprises a metal plate which is received in a metal case and whose peripheral portion is used as a frame member and a U-shaped strip line which is punched out of said metal plate such that one end of the strip line constitutes an integral portion of the frame member and the other end thereof is separated from the frame member.

The features and advantages of this invention will be clearly understood from the following description.

DETAILED DESCRIPTION OF THE PREFERRED EMBODIMENTS

Figure 1:
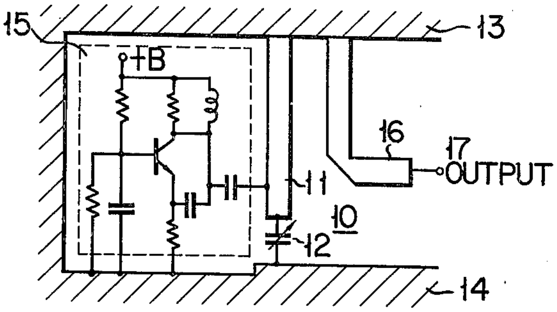
FIG. 1 PRIOR ART
FIG. 1 is a diagram of an oscillator circuit including the resonance circuit which has been used with a UHF television tuner.
Figure 2:
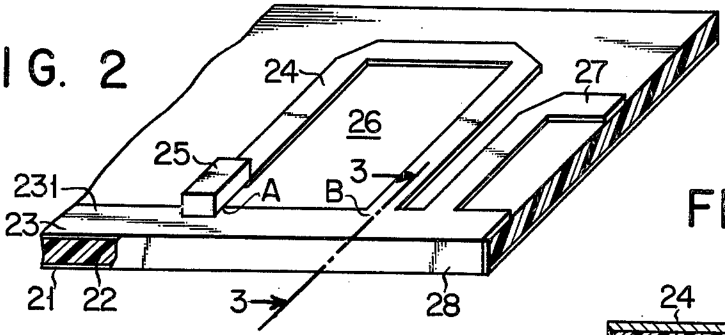
FIG. 2 is an oblique view of a shortened quarter wave length type resonant circuit according to one embodiment of this invention.

Referring to FIG. 2 showing a shortened quarter wavelength type resonant circuit using a microstrip member embodying this invention, a dielectric layer 22 prepared from, for example, glass epoxy resin, glass polyester, Teflon glass or ceramics is mounted on a ground conductor plate made of, for example, copper. Part of the upper surface of the dielectric layer 22 forms a straight ground-contacting portion 23. This ground-contacting portion 23 is electrically connected to a ground-contacting conductive plate 21 through a lateral wall of the later described metal chassis 28 or connection conductor 29. A U-shaped microstrip line 24 acting as a distributed line is formed by etching on the dielectric layer 22 with both ends of said microstrip line 24 so disposed as to face the edge portion 231 of the ground-contacting portion 23. Namely, the microstrip member is formed of the ground-contacting conductive plate 21, dielectric layer 22, ground-contacting portion 23 and U-shaped distributed line 24.

One end portion of the U-shaped distributed line 24 constitutes an integral part of the edge portion 231 of the ground-contacting portion 23, and the other end portion of said U-shaped distributed line 24 is connected to said edge portion 231 by means of a lumped capacitor 25. Thus, the U-shaped distributed line 24 and a lumped capacitor 25 jointly constitute a resonance circuit section 26. An input or output circuit 27 which is formed of a distribued line and is inductively coupled to the resonant circuit section 26 is provided on the dielectric layer 22 to be disposed on one side of the resonance circuit section 26. Said input or output circuit 27 may be formed on both sides of the resonant circuit section 26.

Figure 3A:
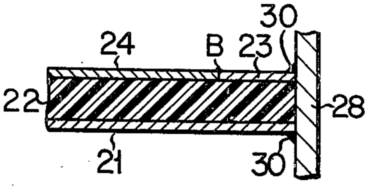
FIGS. 3A, 3B and 3C are cross sectional views on line 3—3 of FIG. 2.

FIG. 3A is a cross sectional view on line 3—3 of FIG. 2. The ground-contacting portion 23 and ground-contacting conductive plate 21 are fixed to the metal chassis 28 by solder 30. Therefore, the ground-contacting portion 23 is electrically connected to the ground-contacting conductive plate 21 through the metal chassis 28.

Figure 3B:
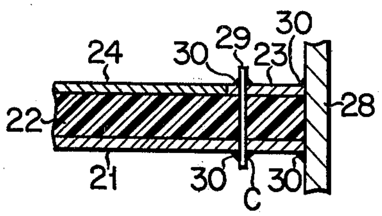

Further, the ground-contacting portion 23 may be connected to the ground, by an arrangement shown in FIG. 3B, namely, by being connected to the round-contacting conductive plate 21 by a metal rod 29 which penetrates the dielectric layer 22 to act as a ground conductor. The metal rod 29 is electrically connected to the ground-contacting portion 23 and ground-conducting conductive plate 21 by being soldered 30 thereto. The ground contacting portion 23 and ground-contacting conductive plate 21 are soldered 30 to the metal chassis 28. Therefore, the ground-contacting points A and B of the resonant circuit section 26 of FIG. 2 are connected to the ground-contacting point C of the ground-conducting conductive plate 21 at a shortest possible distance, thus leading to a decline in the impedance of the ground-contacting points A and B, an increase in the resonant current of the resonant circuit section 26, equivalently a decrease in the resistance of the distributed line 24, and eventually an increase of the Q value of the resonant circuit 10.

Figure 3C:
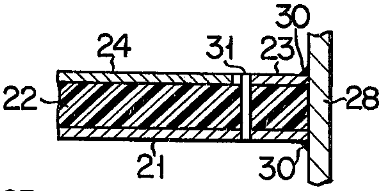

The U-shaped microstrip line acting as a distribued line 24 may also be constructed as shown in FIG. 3C. Namely, the metal rod 29 may be replaced by a through hole 31, on the inner wall of which a conducting membrane is formed.

With the resonant circuit 26 of FIG. 2 including a U-shaped microstrip line acting as a distribued line 24, impedance across the ground-contacting points A and B is so small as to enable the resonance circuit 26 to produce a larger amount of output power.

Since a distance between A and B is shortened, impedance equivalently applied to both ends of the resonant circuit 26 is reduced to decrease a loss of energy discharged from the lumped capacitor 25, thereby enabling the resonant circuit 26 to produce a larger output power.

The lumped capacitor 25 of FIG. 2 comprises series circuit formed of a variable capacitor diode and fixed capacitor. If in this case, a circuit arrangement collectively shown in FIGS. 3D to 3F is applied with the fixed capacitor formed of a plate type capacitor, then a higher efficiency will be attained.

Figure 3D:
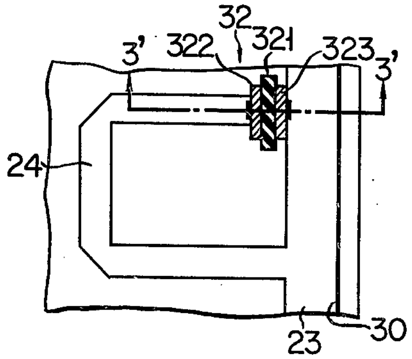
FIG. 3D is a plan view of the resonant circuit section in which the lumped capacitor of FIG. 2 is formed of a plate type capacitor.

Namely, FIG. 3D shows a disk capacitor used as the lumped element 25 of FIG. 2. The plate type capacitor 32 comprises a dielectric plate 321 and electrode plate 322, 323 provided on both sides of the dielectric plate 321. FIG. 3E is a sectional view on line 3′—3′ of FIG. 3D, and FIG. 3F is a bottom view of that portion of the resonant circuit in which the plate type capacitor 32 of FIG. 3D is disposed. As seen from FIGS. 3D to 3F, the plate type capacitor 32 is positioned between the U-shaped microstrip line 24 and ground-contacting portion 23. The plate type capacitor 32 is so set in place as to penetrate the dielectric layer 22 and ground-contacting conductive plate 21. The upper end of one electrode plate 322 of the plate type capacitor 32 is connected to the U-shaped microstrip line 24 by solder 30. The upper end of the other electrode plate 323 is connected to the ground-contacting portion 23 by solder 30, and the lower end of the electrode plate 323 is connected to the ground-contacting conductive plate 21 by solder 30.

A slot 33 bored in the ground-contacting conductive plate 21 to allow the passage of the plate type capacitor 32 is made large enough to prevent the ground-contacting conductive plate 21 from touching the lower end of the electrode plate 322, thereby suppressing the occurrence of short-circuiting between the electrode plates 322, 323.

Figure 3E:
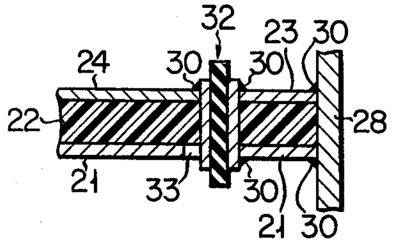
FIG. 3E is a sectional view on line 3′—3′ of FIG. 3D.
Figure 3F:
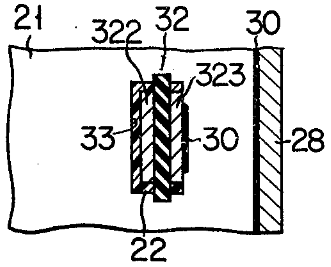
FIG. 3F is a bottom view of the resonant circuit section of FIG. 3D.

A construction illustrated in FIGS. 3D, 3E and 3F enables the grounding point A (FIG. 2) to be connected to the ground-contacting conductive plate 21 at a shortest possible distance through the electrode plate 323. Therefore, the resonance circuit of FIG. 3D has the advantages of not only offering the same merit as the resonance circuit constructed as shown in FIGS. 3B and 3C, but also eliminating the necessity of providing a metal rod or through hole, thereby simplifying the assembly of a resonance circuit.

Figure 4:
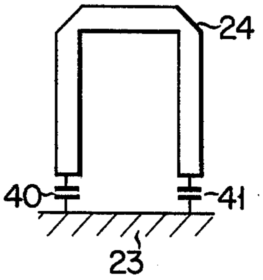
FIG. 4 schematically shows a shortened half wavelength type resonant circuit according to another embodiment of the invention.

The shortened quarter wavelength type resonant circuit section 26 as shown in FIG. 2 may be converted into a shortened half wavelength type resonant circuit shown in FIG. 4, in which both ends of the U-shaped distributed line 24 may be connected to the ground-contacting portion 23 through lumped capacitors 40, 41, for example, varactor diodes and capacitor or the like.

Figure 5:
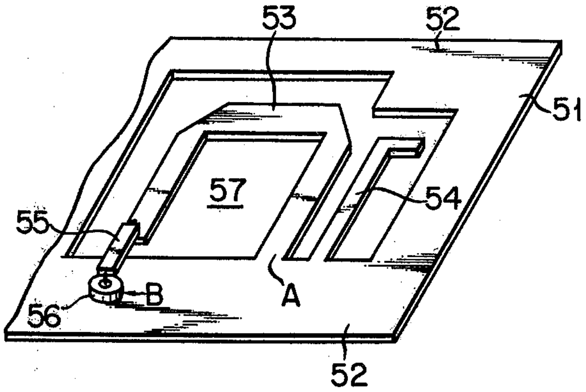
FIG. 5 is an oblique view of a shortened quarter wavelength type resonant circuit according to still another embodiment of the invention which has been punched out of a metal plate.

The above-mentioned microstrip structure of quarter wavelength type resonant circuit section 26 as shown in FIG. 2 may be formed by punching as shown in FIG. 5. Referential numeral 51 of FIG. 5 denotes, for example, a copper plate 1 to 2 mm thick, the periphery of which constitutes a frame section 52 of said resonant circuit section 26. A strip resonant line 53 and an input or output strip line 54 are punched out the copper plate 51. The strip resonant line 53 is formed in a U-shape, and one end thereof constitutes an integral portion of the frame section 52 and the other end thereof is separated from the frame section 52. A varactor diode 55 acting as a lumped capacitor and disc capacitor 56 are connected together in series between the U-shaped strip resonance line 53 and frame section 52. The lumped capacitor formed of the varactor diode 55 and a disc capacitor 56 connected in series and the U-shaped strip resonance line 53 jointly constitute a resonance circuit section 57. One end of the input or output strip line 54 constitutes an integral part of the frame section 52, and the other end thereof is separated from the frame section 52. The input-output microstrip line 54 is punched out of the copper plate 51 and is inductively coupled to the outside of the U-shaped strip resonant line 53.

Figure 6:
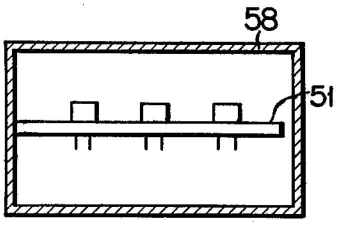
FIG. 6 is a cross sectional view of the resonant circuit of FIG. 5 received in a metal case.

A plurality of circuits including the above-mentioned resonant circuit sections are mounted on the copper plate 51, which is received, as shown in FIG. 6, in a shield case 58 to be saved from external effects.

With a circuit using a strip member of FIG. 5 punched out of, for example, a copper plate 51, various forms of frequency adjustment, for example, very minute frequency variation can be very easily effected simply by manually changing the shape of the strip line. The punched strip line of FIG. 5 has the advantage of being easily designed and manufactured.

The resonant circuit section 57 shown in FIG. 5 may be constructed as same manner as the shortened half wavelength type resonant circuit as shown in FIG. 4.

The microstrip member and the strip member of this invention (shown in FIGS. 2 and 5) is used as an inductance element of the resonant circuit section, making it possible to connect various ground-contacting points of the resonant circuit section to the same ground-contacting portion.

Figure 7:
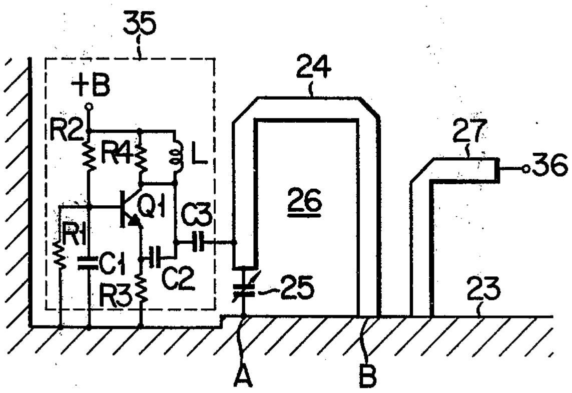
FIG. 7 shows a UHF tuner oscillator circuit using a resonant circuit embodying this invention.

FIG. 7 shows a local oscillator circuit including the resonant circuit of FIG. 2 to be used with a UHF television tuner. The resonant circuit section 26 is provided in a feedback loop of the signal oscillating section 35. In this case, the lumped capacitor 25 of the resonant circuit section 26 is formed of a varactor diode or a varactor diode combined with an ordinary capacitor. The signal oscillating section 35 is formed of a circuit customarily used with a UHF television tuner. A resistor R1 and capacitor C1 are connected in parallel between the base of a transistor Q1 and ground-contacting portion 23. The base resistor R2 is connected between the base of the transistor Q1 and a +B power source. An emitter resistor R3 is connected between the emitter of the transistor Q1 and the ground-contacting portion 23. An output resistor R4 and L are connected in parallel between the collector of the transistor Q1 and the +B power supply source. The capacitor C2 is connected between the collector and the emitter of the transistor Q1. One end of a coupling capacitor C3 is connected to the collector of the transistor Q1, and the other end of the coupling capacitor C3 is connected to the microstrip line 24 of the resonant circuit section 26.

With the local oscillator circuit, an impedance of that portion of the ground-contacting portion 23 which lies between the ground-contacting points A and B of the resonance circuit section 26 can be substantially neglected, resulting in little loss of energy charged into and discharged from the lumped capacitor 12 and consequently enabling the output terminal 36 of said local oscillator circuit to produce a sufficient amount of oscillated output power. Moreover, since the inductance of that portion of the ground-contacting portion 23 which lies between the ground-contacting points A and B of the resonant circuit section 26 and a stray capacitance can be substantially neglected, occurrence of parasitic oscillations resulting from the above mentioned inductance and stray capacitance is minimized. Therefore, energy delivered from the signal oscillating section is efficiently concentrated in the resonance frequency of the resonant circuit section 26, offering the advantages that the signal oscillating circuit 35 carries out a stable oscillation over a fully broad frequency band according to the changes in the capacitance of the lumped capacitor 25 and produces a prominently increased amount of power.

Figure 8:
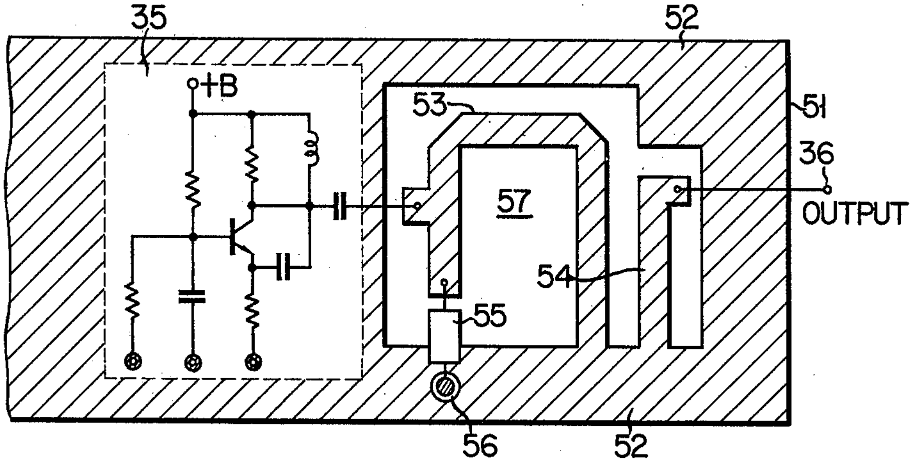
FIG. 8 indicates a UHF tuner oscillator circuit using a resonant circuit punched out of a metal plate.

A resonance circuit including the U-shaped strip line of FIG. 5 formed by punching may be connected to the feedback loop of the signal oscillator circuit 35 to provide a local oscillator circuit arranged as shown in FIG. 8.

Figure 9:
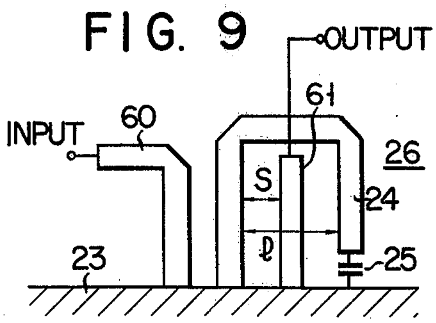
FIG. 9 presents a single tuning circuit for a UHF television tuner using a resonance circuit embodying this invention.

FIG. 9 illustrates a resonant circuit including the strip member of this invention which is applied to an input single tuning circuit for use with a UHF television tuner. Referring to FIG. 9, one end of an input circuit 60 formed of a strip line is connected to the ground-contacting portion 23. A resonant circuit section 26 comprising a U-shaped strip line 24 and a lumped capacitor 25 is so disposed as to face the input circuit 60. One end of an output circuit 61 formed of a strip line is connected to the ground-contacting portion 23 on the inside of the U-shaped strip line 24. The output circuit 61 is inductively coupled to the U-shaped strip line 24.

Figure 10:
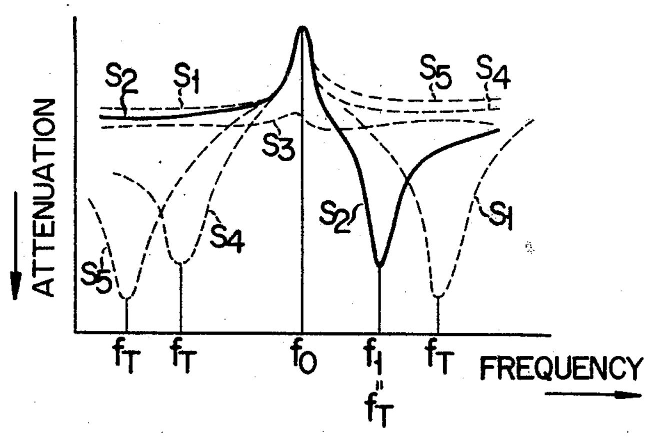
FIG. 10 shows the frequency charcteristics of the single tuning circuit of FIG. 9 where an output line circuit has its position changed.

Where, with the above-mentioned single tuning circuit, l was taken to denote a distance between the mutually facing lines of the U-shaped strip line 24, and S was taken to represent a distance between one ground-contacting line of said U-shaped strip line 24 and the I-shaped strip line 61, and the strip line 61 was formed by varying the distance S within the range of the distance l, then the single tuning circuit presented a frequency characteristic plotted in the form of a curves indicated in FIG. 10, in which the frequency of oscillation carried out by the single tuning circuit is shown on the abscissa and the attenuation of said oscillation is indicated on the ordinate. Referring to FIG. 10, when the distance S is so small, a trap frequency fT is higher than a resonance frequency f) appeared in the U-shaped strip line 24. Where the distance S is progressively increased, at the rate of $S1<S2<S3\ldots<S5$ as shown in FIG. 10, then the trap frequency fT approaches the resonance frequency fO and conforms to an image frequency fI when S becomes equal to S2. Polarity changes in the proximity of a point indicated by $S = S3$(or $S \approx l/2$). Since the frequency of fO and fT coincides with each other at said polarity-changing point, tuning property disappears as shown in FIG. 10. Where the distance S is more increased, the frequency fT becomes lower than the frequency fO. Where the output-transmitting circuit 61 is so formed as to result in $S = S2$ or $fT \approx fI$, then it is possible to provide a single tuning circuit capable of improving the image frequency rejection ratio.

Where the resonance circuit is used as an input single tuning circuit disposed ahead of a radio frequency amplifier of a UHF television tuner, then said single tuning circuit can elebate the frequency rejection ratio to an extent of 20 to 30 decibels by causing a trap frequency to conform to an image frequency.

In case of $S = S2$, the output strip line 61 is disposed on that side of the U-shaped strip resonant line 24 which is directly connected to the ground-contacting portion 23, thereby preventing inductive coupling between the U-shaped strip line 24 and output-strip line 61 from being weakened, suppressing an increase in power loss and eventually making it possible to use a sufficiently small noise factor.

Figure 11:
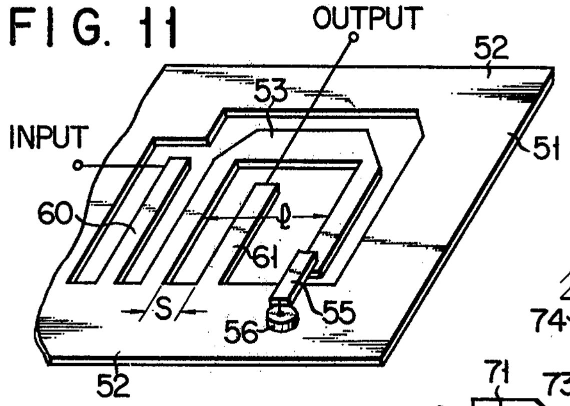
FIG. 11 illustrates a single tuning circuit punched out of a metal plate.

The single tuning circuit can obviously be formed, as shown in FIG. 11, by punching strip lines out of, for example, a copper plate as in the preceding case.

Figure 12:
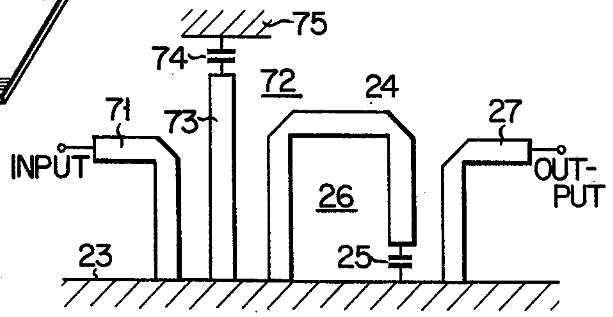
FIG. 12 indicates a band pass filter circuit using a strip resonant circuit embodying this invention.

FIG. 12 represents the case where a resonant circuit including the strip member of this invention is applied as a band pass filter. With this filter circuit arranged as shown in FIG. 12, a resonant circuit section 72 is positioned adjacent to a strip line 71 acting as an input-strip line one end of which is connected to the ground-contacting portion 23. One end of strip line 73 included in said resonant circuit section 72 is connected to the ground-contacting portion 23, and the opposite free end is connected to a ground-contacting portion 75 through a lumped capacitor 74. A resonant circuit section 26 formed of a U-shaped microstrip line 24 and lumped capacitor 25 is disposed adjacent to said resonant circuit section 72. Disposed adjacent to the resonant circuit section 26 is an L-shaped microstrip line 27 acting as an output-transmitting circuit, one end of which is connected to the ground-contacting portion 23.

Figure 13:
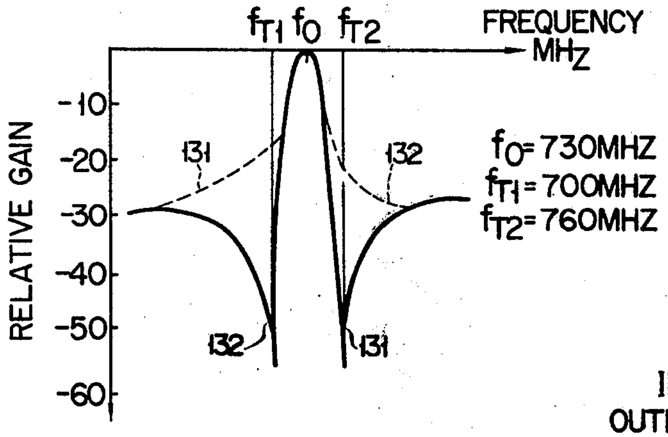
FIG. 13 shows the frequency characteristic of the band pass filter circuit of FIG. 12.

FIG. 13 shows the frequency characteristic of the band pass filter of FIG. 12. In this case, the characteristic curve of the filter is a combination of the frequency characteristic curve 131 of the resonant circuit 72 and the frequency characteristic curve 132 of the resonant circuit 26. As apparent from FIG. 13, a trap frequency fT1 of 700 MHz delivered from the resonant circuit section 26 and a trap frequency fT2 of 760 MHz issued from the resonant circuit section 72 appear or both sides of a central resonant frequency fO of 730 MHz in the vertical direction thereof. Other frequencies than those lying within a certain frequency band fall very sharply. Therefore, the band pass filter easily selects signals whose frequencies closely approach each other, and is most adapted to eliminate the upper and lower side band waves of a signal particularly subjected to amplitude modulation.

Figure 14:
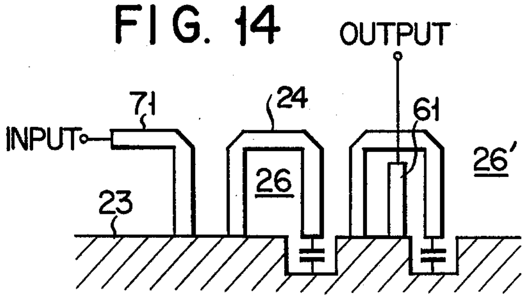
FIG. 14 sets forth a modification of the band pass filter circuit of FIG. 12.

FIG. 14 shows a modification of the band pass filter, circuit of FIG. 12. An I-shaped microstrip line 61 acting as an output-transmitting line similar to that of FIG. 9 is provided inside of a U-shaped distributed line 24. The trap frequency fT can be made higher than the resonance frequency according to the point at which the I-shaped microstrip line 61 acting as an output-transmitting line is connected. A second resonance circuit section 26' is provided adjacent to a first resonant circuit section 26. The band pass filter of said second resonant circuit section 26' has the same effect as that included in the resonant circuit section 72 of FIG. 9.

The U-shaped microstrip line and L and I shaped microstrip line used with the band pass filters of FIGS. 9 and 14 may be punched out of a metal plate as in the preceding case.

Figure 15:
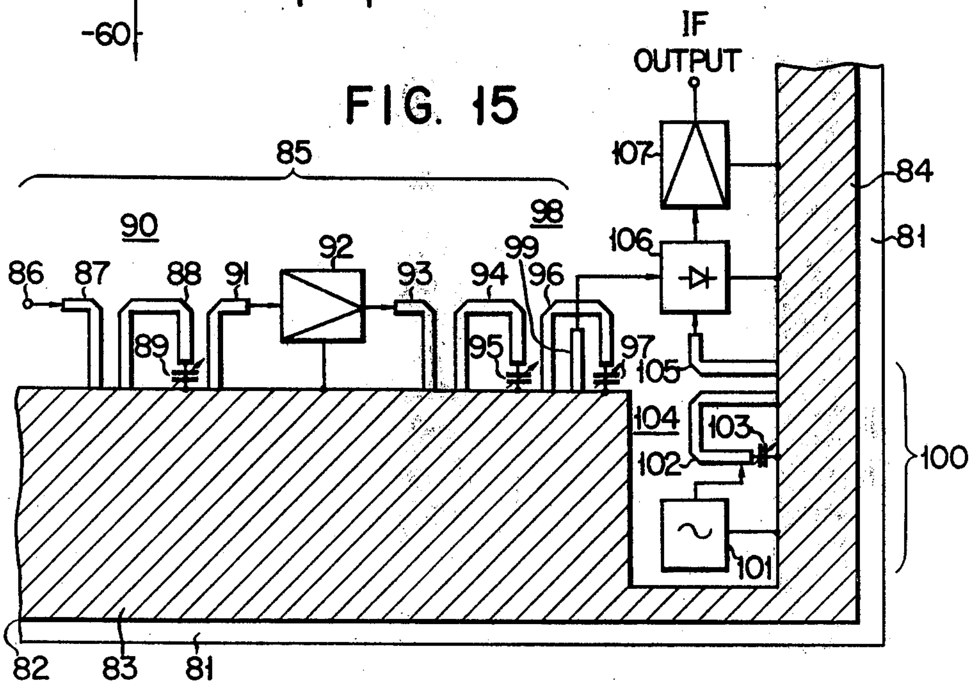
FIG. 15 schematically illustrates a UHF tuner using a resonant circuit embodying this invention.

FIG. 15 shows the case where a resonant circuit including the U-shaped strip line of this invention is applied to a UHF television tuner. With this UHF television tuner, the strip line may be constructed as shown in FIG. 2 or punched out of a metal plate as shown in FIG. 5. The strip lines are mounted on a dielectric layer (not shown) in a state abutting against the ground-contacting portion 83 soldered 82 to a metal chassis 81. Referential numeral 85 denotes a high frequency transmission circuit section. An antenna input terminal 86 is provided with an input single tuning circuit 90 formed of a U-shaped distributed strip line 88 coupled with a strip line 87 acting as an input-strip line and a lumped variable capacitor 89. A radio frequency amplifier 92 is connected to the output of said single tuning circuit 90 through a strip line 91 acting as an output transmitting line. There is further provided an interstage double tuning circuit 98 including a U-shaped strip line 94 connected to the output side of the radio frequency amplifier 92 through a strip line 93 acting as an input-transmitting line, a variable lumped capacitor 95, a U-shaped strip line 96 and a lumped capacitor 97. Referential numeral 99 denotes an output line for leading out an output from the interstage double tuning circuit 98. The high frequency transmission circuit section 85 is mounted on a dielectric layer, with the ground-contacting points thereof connected to the edge of the ground-contacting portion 83.

Referential numeral 100 denotes a local oscillator circuit section, which comprises a signal-oscillator section 101 and a resonant circuit section 104 formed of a U-shaped line 102 provided on the output side of said signal-oscillator section 101 and variable lumped capacitor 103. An output signal from the local oscillator circuit section 100 is conducted through strip line 105 to a signal-mixing circuit 106 to be mixed with an output signal supplied from the high frequency circuit section 85 through the output-transmitting line 99. Later, a signal of intermediate frequency is drawn off from an intermediate frequency amplifier 107. Ground-contacting points of the signal-mixing circuit 106 and intermediate frequency amplifier 107 are connected to the edge of the ground-contacting portion 84.

As apparent from FIG. 15, the ground-contacting portions 83, 84 are disposed at right angles to each other. The edges of the ground-conttacting portions 83, 84 are connected to the ground-contacting points of the strip lines, desirably resulting in a considerable decrease in a force with which the high frequency transmission circuit section 85 and local oscillator circuit section 32 are inductively coupled. With a circuit arrangement using strip lines, circuits arranged in a direction parallel with the ground-contacting portion 83 are most prominently subject to mutual induction, whereas circuits coupled in a direction perpendicular to the ground-contacting portion 83 are little affected by induction from the circuits provided in the first mentioned parallel direction. As the result, an oscillated output signal from the local oscillator circuit section 100 inductively affects the high frequency transmission circuit section 85, extremely reducing the leakage of signals from the antenna input terminal 86.

A provided with a resonant circuit including a U-shaped strip lines and arranged as shown in FIG. 15 gives full play to the advantageous features of the U-shaped strip lines and can be manufactured in the compact and light weight form with an excellent frequency characteristic.

What we claim is:

1. A resonant circuit comprising a ground-contacting conductive member; a dielectric layer provided on said ground-contacting conductive member; a ground-contacting member provided on said dielectric layer and electrically connected to said ground-contacting conductive member; at least one U-shaped microstrip line formed on said dielectric layer and having two ends each facing said ground-contacting member; and at least one lumped capacitor connected to said U-shaped microstrip line, one end of said U-shaped microstrip line being grounded through the lumped capacitor of the resonant circuit and the other end thereof being grounded by way of direct grounding.

2. A resonant circuit according to claim 1, wherein said ground-contacting member is electrically connected to said ground-contacting conductive member by a conductor which passes through said dielectric layer at a portion adjacent to one end of said U-shaped microstrip line.

3. A resonant circuit according to claim 1, wherein a plate type capacitor is provided between one end of said U-shaped microstrip line and said ground-contacting member so as to penetrate said dielectric layer and said ground-contacting conductive member, said plate type capacitor comprising a dielectric element and electrode plates provided on both sides of said dielectric element, one of said electrode plates being connected to said ground-contacting member and said ground-contacting conductive member at a position adjacent to one of ends of said microstrip line and the other electrode plate being connected to said microstrip line.

4. A resonant circuit according to claim 1, further comprising an input microstrip line disposed adjacent to the input side of said U-shaped microstrip line to be inductively coupled thereto with one end grounded and an output microstrip line provided between the mutually facing portions of said U-shaped microstrip line to be inductively coupled thereto with one end grounded.

5. A resonant circuit according to claim 4, wherein said output microstrip line is so positioned as to cause the trap frequency of the resonant circuit to be equal to an image frequency.

6. A resonant circuit comprising a ground-contacting conductive member; a dielectric layer provided on said ground-contacting conductive member; a ground-contacting member provided on said dielectric layer and electrically connected to said ground-contacting conductive member; at least one U-shaped microstrip line formed on said dielectric layer and having two ends each facing said ground-contacting member; wherein both ends of said U-shaped microstrip line are grounded respectively through two lumped capacitors, one of which is a fixed valued capacitor and the other of which is a varactor diode.

7. An oscillator circuit comprising an oscillating section and a resonant section provided in a feedback loop of the oscillating section, said resonant section comprising a resonant circuit which comprises a ground-contacting conductive member, a dielectric layer provided on said ground-contacting conductive member, a ground-contacting member provided on said dielectric layer and electrically connected to said ground-contacting conductive member, an U-shaped microstrip line formed on said dielectric layer and having both ends facing said ground-contacting member, and at least one lumped capacitor connected to said U-shaped microstrip line, one of said two ends of said U-shaped microstrip line being grounded through the lumped capacitor of the resonant circuit and the other end thereof being grounded by way of direct grounding.

8. A tuning circuit comprising a resonant circuit, an input microstrip line inductively coupled to the resonant circuit at the input side of the resonant circuit, and an output microstrip line, wherein said resonant circuit comprises a ground-contacting conductive member; a dielectric layer provided on said ground-contacting conductive member; a ground-contacting member provided on said dielectric layer and electrically connected to said ground-contacting conductive member; a first U-shaped microstrip line inductively coupled to said input microstrip line; a second U-shaped microstrip line inductively coupled to said first U-shaped microstrip line, each U-shaped microstrip line being provided on said dielectric layer and having both ends facing ground-contacting member, one end of each U-shaped microstrip line being grounded through a lumped capacitor and the other end thereof being grounded by way of direct grounding, said input microstrip line being provided on said dielectric layer with one end being grounded, and said output microstrip line being provided on said dielectric layer with one end grounded and between the mutually facing portions of said second U-shaped microstrip line.

9. A tuning circuit according to claim 8, wherein said output microstrip line is disposed at a selected position between the mutually facing portions of said second U-shaped microstrip line so as to cause the trap frequency of the resonant circuit to be equal to an image frequency.

* * * * *